United States Patent [19]
Hsu et al.

[11] Patent Number: 6,117,268
[45] Date of Patent: Sep. 12, 2000

[54] APPARATUS FOR CARRYING SUBSTRATES PROCESSED IN AN ETCHING PROCESS AND PROTECTING THEREOF FROM BEING DAMPENED BY DROPLETS

[75] Inventors: Wen Chi Hsu, Hualien Hsien; Yinan Chen; Shang-Shu Chung, both of Taipei; Jung-Hsing Chien, Taoyuan; Jyh Shorng Horng, Taipei; Chien-Hua Lee, Taipei Hsien, all of Taiwan

[73] Assignee: Nanya Technology Corporation, Taiwan

[21] Appl. No.: 09/363,168

[22] Filed: Jul. 29, 1999

[30] Foreign Application Priority Data

May 12, 1999 [TW] Taiwan ................. 88207576

[51] Int. Cl.[7] ............... C23F 1/02; B08B 3/00; B65G 49/07
[52] U.S. Cl. .............. 156/345; 134/82; 414/935
[58] Field of Search ............. 156/345; 134/82, 134/83, 95.3, 962; 414/935–938, DIG. 2

[56] References Cited

U.S. PATENT DOCUMENTS

| 3,964,957 | 6/1976 | Walsh | 156/345 |
| 5,685,040 | 11/1997 | Onodera | 15/97.1 |
| 5,829,156 | 11/1998 | Shibasaki et al. | 34/58 |

*Primary Examiner*—Jeffrie R Lund
*Assistant Examiner*—Alva C Powell
*Attorney, Agent, or Firm*—George T. Marcou; Kilpatrick Stockton LLP

[57] ABSTRACT

The apparatus of the present invention is used to carry substrates processed in an etching process and provides a guiding member to shelter and protect substrates from being dampened by droplets. The apparatus comprises spaced chucks connected to a substrate holder with two arms, respectively. The guiding member is a roof plate disposed under the chucks and abutted against the arms, so that the guiding member can induce the droplets falling from the chucks to flow to the arms. The substrates can be effectively kept dry and clean.

16 Claims, 2 Drawing Sheets

APPARATUS FOR CARRYING SUBSTRATES PROCESSED IN AN ETCHING PROCESS AND PROTECTING THEREOF FROM BEING DAMPENED BY DROPLETS

BACKGROUND OF THE INVENTION

1. Field of the Invention

This invention relates to an apparatus for carrying substrates processed in an etching process and protecting the substrates from being dampened by droplets. More particularly, this invention relates to an apparatus provided with a guiding member to protect substrates from being dampened by droplets.

2. Description of Prior Art

When wafers loaded on a boat supported with chucks undergo etching and cleaning processes, water and etching agent partially dampen the surfaces of the chucks. The etching agent and water gradually accumulates until the volume is sufficient to form droplets on the chucks, at which point a large quantity of saturated droplets drop naturally onto the wafers of on the boat. Therefore, the surface of each wafer 3 cannot be effectively kept dry and clean.

SUMMARY OF THE INVENTION

To solve the above problem, the primary object of this invention is to provide a guiding member serving as a shelter disposed over the substrates and abutted against two arms, so that droplets formed the base and the chucks can be prevented from dropping onto the substrates. The droplets dropping on the guiding member are guided to flow to the arms, and then these droplets are finally expelled from the apparatus through the arms.

The present invention is characterized in that the guiding member serves as a roof plate comprising at least two slants inclined against the arms. The guiding member is disposed over the substrates to protect them from being dampened by dropping droplets.

BRIEF DESCRIPTION OF THE DRAWINGS

The present invention can be more fully understood by reading the subsequent detailed description and examples with reference made to accompanying drawings in which.

DETAILED DESCRIPTION OF THE PREFERRED EMBODIMENTS

Figure 1:
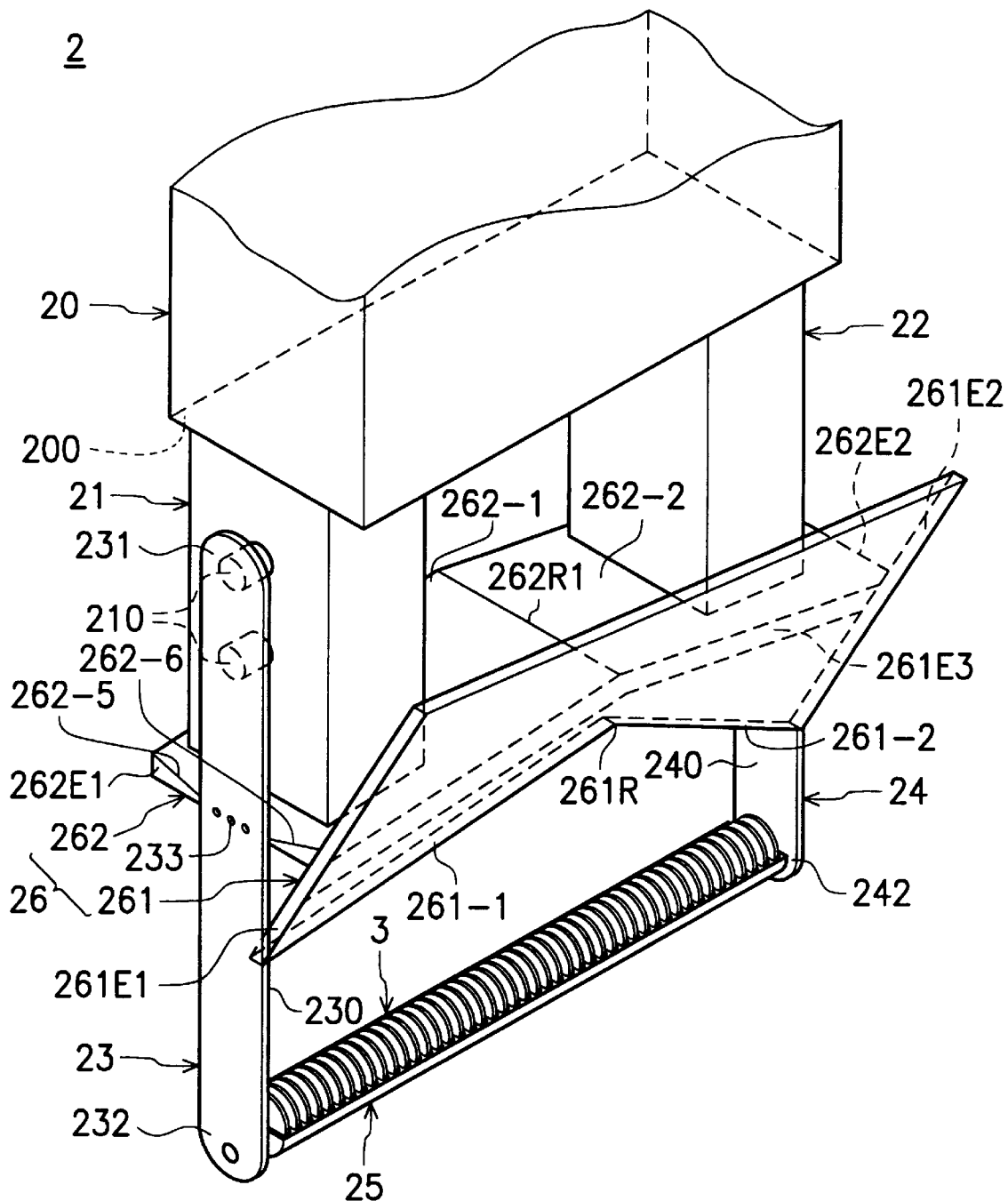
FIG. 1 is a perspective view showing the structure of a holding apparatus 2 according to the present invention.
Figure 2:
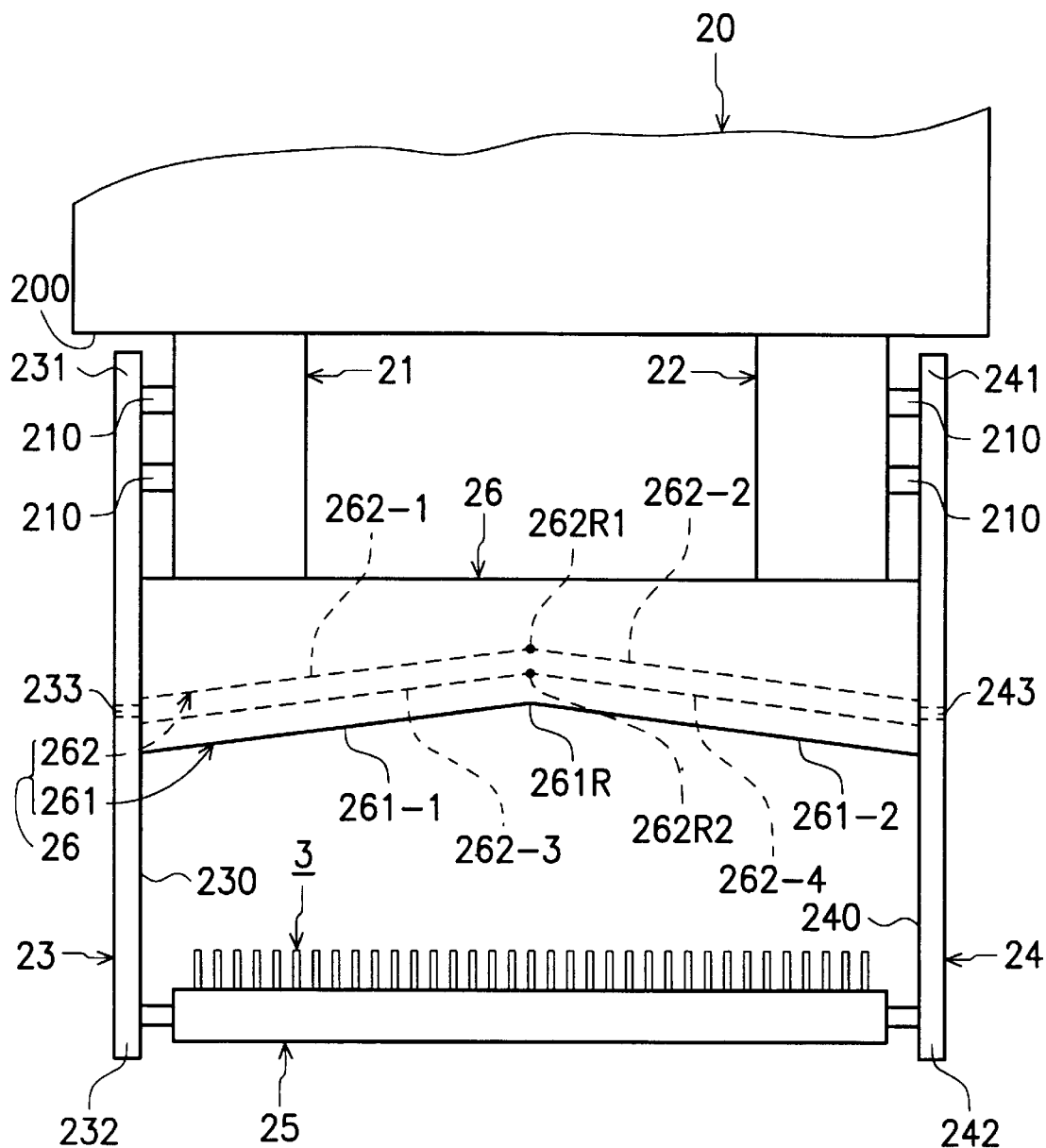
FIG. 2 is a side view of the holding apparatus 2 according to FIG. 1.

Referring to FIG. 1 and FIG. 2, FIG. 1 is a perspective view showing the structure of a holding apparatus 2 according to the present invention, and FIG. 2 is a side view of the holding apparatus 2 according to FIG. 1.

As shown in FIG. 1, the holding apparatus 2 comprises a base 20 with two spaced chucks 21(22), a holding member having two spaced arms 23(24) and a holder 25 connected to the base 20, and a guiding member 26. The guiding member 26 is disposed between the chucks 21(22) and the holder 25.

A robot (not shown in Figs.) is used to move the holding apparatus 2 to the etching chamber and the cleaning chamber (not shown in FIGS.) during the etching process.

The chucks 21, 22 spaced apart from each other are downwardly extended from the bottom 200 of the base 20, and the ends 231, 241 of the arms 23, 24 are respectively connected to the chucks 21, 22 with the posts 210. The holder 25, used to load substrates 3 such as semiconductor wafers (hereinafter referred it as wafers), is a longitudinal container connected to the end 232 of the arm 23 and the end 242 of the arm 24.

Referring to FIG. 2, the side view of the holding apparatus 2 according to FIG. 1 is shown. Plates 261, 262 form the guiding member 26. The plate 262 is a roof plate comprising an outer ridge 262R1 and an inner ridge 262R2 so as to shelter the wafers 3. The outer ridge 262R1 facing the base 20 is intersected by a first slant 262-1 and a second slant 262 which are respectively connected to the chucks 21, 22. The inner ridge 262R2, opposite to the outer ridge 262R1 and facing the wafers 3, is intersected by a third slant 262-3 and a forth slant 262-4. As shown in FIG. 1, two end surfaces 262E1, 262E2 of the plate 262 are respectively abutted against the side 230 of the arms 23 and the side 240 of the arm 24, and the end surface 262E3 of the plate 262 is connected to the plate 261. The intersection between the first slant 262-1 and the end surface 262E1 provides two inclined edges 262-5, 262-6 formed with a V-shaped section, and the intersection between the second slant 262-2 and the end surface 262E2 also provides two inclined edges (not shown in the figures). The arms 23, 24 provided with through holes 233, 243 (shown in FIG. 2) correspond to the inclined edges 262-5, 262-6, respectively.

The plate 261 is kept at an inclination with respect to the plate 262 and have a ridge 261R intersected by a first end surface 261-1 and a second end surface 261-2. The end surfaces 261E1, 261E2 are respectively abutted against the side 230 of the arm 23 and the side 240 of the arm 24.

As the wafers 3 are processed in the cleaning chamber, the surfaces of the wafers 3, the holder 25 and the arms 23, 24 and the base 20 are dampened with water. When the wafers 3 are etched in the etching chamber, water reacts strongly with the etching solution (such as sulfuric acid). The endothermic and exothermic reaction between the solution and water causes a lot of the water and etching solution to spray on the surface of the base 20, the chucks 21(22), and the guiding member 26. The etching agent and water gradually accumulate until the volume is sufficient to form droplets on the chucks 21(22) and base 20, at which point the saturated droplets drop naturally on the guiding member 26 by the force of gravity. The first slant 262-1 and the second first slant 262-2 of the plate 262 guide these droplets to flow to the arms 23, 24 and pass through the holes 233, 243, and then to finally leave the apparatus. The droplets formed on the plate 262 are also guided by the third slant 262-3 and the forth slant 262-4 to flow to the arms 23, 24. In addition, the droplets formed on the plate 261 also can be gathered and guided by the first end surface 261-1 and the second end surface 261-2 to leave the plate 261.

The droplets of the mixture formed on the base 20 and the chucks 21(22) are gathered to flow along the arms 23(24) and leave the apparatus 2. The wafers 3 can be effectively sheltered under the guiding member 26 and protected from being dampened by droplets falling from the base 20 and the chucks 21(22). Therefore, the surface of each wafer 3 can be kept dry and clean.

What is claimed is:

1. An apparatus for carrying substrates processed in an etching process and protecting thereof from being dampened by droplets, comprising:

a base;

a holding means connected to said base with at least one arm for holding said substrates; and a guiding means disposed under said base and preventing said substrates from being dampened by said droplets, said guiding means being abutted against said arm for guiding said droplets formed on said base to flow to said arm.

2. The apparatus as claimed in claim 1 further comprising two spaced chucks extended from said base, and two arms are connected respectively to said chucks as well as connected to said holding means, and said guiding means is disposed under said chucks and abutted against said arms.

3. The apparatus as claimed in claim 2, wherein said guiding means is a roof plate comprising at least two slants abutted against said arms, respectively.

4. The apparatus as claimed in claim 3, wherein said droplets are formed of water.

5. The apparatus as claimed in claim 4, wherein said substrates are semiconductor wafers.

6. The apparatus as claimed in claim 3, wherein said droplets are generated from said etching process and are a mixture comprising etching agent and water.

7. The apparatus as claimed in claim 6, wherein said etching agent is sulfuric acid.

8. The apparatus as claimed in claim 7, wherein said substrates are semiconductor wafers.

9. An apparatus for carrying substrates processed in an etching process and protecting thereof from being dampened by droplets, comprising:

a base with two spaced chucks;

a holding means for holding said substrates, connected to said chucks with two spaced arms, respectively; and a guiding means disposed under said base and preventing said substrates from being dampened by said droplets, said guiding means being abutted against said arms for guiding said droplets formed on said base and said chucks to flow to said arms.

10. The apparatus as claimed in claim 9, wherein said guiding means is a roof plate sheltering said substrates which is disposed under said chucks and said base and abutted against said arms.

11. The apparatus as claimed in claim 10, wherein said guiding means comprises at least two slants abutted against said arms, respectively.

12. The apparatus as claimed in claim 11, wherein said droplets are formed of water.

13. The apparatus as claimed in claim 12, wherein said substrates are semiconductor wafers.

14. The apparatus as claimed in claim 11, wherein said droplets are generated from said etching process and are a mixture comprising etching agent and water.

15. The apparatus as claimed in claim 14, wherein said etching agent is sulfuric acid.

16. The apparatus as claimed in claim 15, wherein said substrates are semiconductor wafers.

* * * * *